(12) United States Patent
Kamigaki

(10) Patent No.: US 6,494,122 B2
(45) Date of Patent: Dec. 17, 2002

(54) ALIGNMENT METHOD AND APPARATUS FOR ALIGNING CUTTING BLADE

(75) Inventor: Masakado Kamigaki, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/898,009

(22) Filed: Jul. 5, 2001

(65) Prior Publication Data

US 2002/0025616 A1 Feb. 28, 2002

(30) Foreign Application Priority Data

Jul. 14, 2000 (JP) ........................... 2000-214552

(51) Int. Cl.[7] .................. B26D 1/00; B26D 5/20; B26D 3/08
(52) U.S. Cl. ..................... 83/13; 83/881; 83/76.6; 83/76.7; 83/929.1; 125/20; 125/23.01
(58) Field of Search ..................... 83/13, 880, 881, 83/882, 883, 884, 886, 27, 34, 76.1, 76.6, 76.7, 76.8, 929.1; 125/13.01, 20, 23.01

(56) References Cited

U.S. PATENT DOCUMENTS

| | | | |
|---|---|---|---|
| 5,353,551 A | * 10/1994 | Nishida | 451/5 |
| 5,842,461 A | * 12/1998 | Azuma | 125/13.01 |
| 6,102,023 A | * 8/2000 | Ishiwata et al. | 125/13.01 |
| 6,142,138 A | * 11/2000 | Azuma et al. | 125/13.01 |
| 6,345,616 B1 | * 2/2002 | Umahashi | 125/13.01 |
| 6,427,676 B2 | * 8/2002 | Akram et al. | 125/13.01 |

FOREIGN PATENT DOCUMENTS

JP 9-052227 2/1997

* cited by examiner

*Primary Examiner*—M. Rachuba
(74) *Attorney, Agent, or Firm*—Wenderoth, Lind & Ponack, L.L.P.

(57) ABSTRACT

Alignment method and apparatus for aligning a cutting blade with a selected street on a semiconductor wafer. It has square chip areas defined by crossing streets and alignment spots formed on its surface. Two street lines with at least one street intervening therebetween are selected, and linear functions $f(x)$ and $g(x)$ are determined on the basis of the coordinates of their alignment spots according to the least squares method. The linear functions $f(x)$ and $g(x)$ run among the alignment spots at the closest distances thereto to represent the two selected streets. Another linear functions $f'(x)$ and $g'(x)$ are determined by putting the linear functions $f(x)$ and $g(x)$ into parallelism with the X-axis. The angular difference and the distance between the two selected streets from the linear functions $f'(x)$ and $g'(x)$, and the angular difference and inter-distance are divided by the number of street-to-street spaces between the two selected streets to provide the angle of correction and the indexing amount per street. Beginning with the street adjacent to one of the two selected streets the cutting blade is aligned sequentially with the subsequent intervening streets.

8 Claims, 6 Drawing Sheets

ALIGNMENT METHOD AND APPARATUS FOR ALIGNING CUTTING BLADE

BACKGROUND OF THE INVENTION

1. Field of the Invention

The present invention relates to an alignment method and apparatus for aligning a cutting blade with a selected street to be cut on a workpiece such as a semiconductor wafer having chip areas defined by a plurality of crossing streets, which are formed on the upper surface of the semiconductor wafer.

2. Related Arts

Referring to FIG. 7, a semiconductor wafer has square chip areas C defined by crossing streets S1 and S2, which run in first and second directions to form a lattice pattern on the upper surface of the wafer. Each square chip area has an integrated circuit pattern formed thereon, and the semiconductor wafer is diced to provide square chips C by cutting the crossing streets S1 and S2. Each square chip is packaged, and the so packaged chip can be used in an electronics device.

To meet the recent demand for reducing electronics in size, thickness and weight, chip size packages (abbreviated as CSPs) have been widely used. In the CSP two or more semiconductor chips are laid on each other and bonded together, and the so layered assembly is laid on a printed board having spherical terminals appearing on its rear side. A resin material is molded to the whole structure to provide a single CSP board 100, as shown in FIG. 8. The CSP board 100 is diced by cutting the crossing streets S1 and S2 to provide packaged devices as large as the semiconductor chip.

In dicing either the semiconductor wafer W and CSP board 100 as shown in FIGS. 7 and 8 respectively, first, the cutting blade is put in alignment with a selected street, and then said selected street is cut. Thereafter, the cutting blade is shifted a street-to-street distance every time the cutting has been completed. It should be noted that alignment of the cutting blade with a selected street is effected only once at the beginning. This step-by-step indexing mode depends on the assumption that all streets run exactly in parallelism.

As a matter of fact, however, streets are liable to be slant more or less. The parallelism of streets is apt to be lowered particularly in a case where a resin material is molded to the CSP board; the CSP board is apt to be deformed when covered with resin. If the cutting is made by moving the cutting blade a predetermined street-to-street distance in such case that all streets don't run exactly in parallelism, it may happen that the cutting blade invades the chip area C (see FIG. 7) so that the semiconductor device may be damaged.

To avoid such unfavorable incident, it has been proposed that indexing alignment is repeated prior to the cutting of each and every street (see Japanese Patent H09-52227(A)). This, however, takes much time, lowering the productivity accordingly.

Therefore, there has been an ever-increasing demand for dicing semiconductor wafers with precision even though their streets should not run strictly in parallelism.

SUMMARY OF THE INVENTION

To attain this object according to the present invention, in dicing a workpiece having a plurality of chip areas defined by a plurality of streets running and crossing in a first and a second directions and a plurality of alignment spots formed on a surface of the workpiece, the workpiece being diced by a dicing machine including at least a chuck table for fixedly holding the workpiece, the chuck table being rotatable, and being adapted to be put in a controlled angular position; a cutting means having a cutting blade; a feeding means for moving the chuck table and/or the cutting means relative to each other in directions in which required cutting may be effected on the workpiece; and indexing means for moving the chuck table and/or the cutting means a street-to-street distance, an alignment method for aligning a selected street and the cutting blade with each other, is improved according to the present invention in that it comprises:

a first step of: imaging the surface of the workpiece to detect alignment spots which permit recognition of selected first and second streets running in same direction with at least one street intervening therebetween, determining and storing X- and Y-coordinates of the first and second streets, provided that X-axis is corresponding to a feeding-and-cutting direction whereas Y-axis is corresponding to a feeding-and-indexing direction;

a second step of: determining an angular difference between an inclination of the first street and that of the second street based on the coordinates of the detected alignment spots, obtaining an angle of correction for each street by dividing the angular difference by number of street-to-street spaces existing between the first and second streets, and storing the angle of correction;

a third step of: putting the first and second streets in parallelism with the X-axis to determine the Y-coordinates of intercept of so oriented first and second streets and a distance between the so oriented first and second streets, determining an indexing amount by dividing so determined distance by number of the street-to-street spaces existing between the first and second streets, and storing so determined indexing amount; and a fourth step of: moving the cutting blade and/or the workpiece in the Y-axial direction based on both of the so determined angle of correction and the indexing amount so that the cutting blade may be put exactly in alignment with a selected street to be cut.

In the first step, at least three alignment spots may be detected for recognizing each of the first and second streets, and the coordinates of the so detected alignment spots are stored;

in the second step, a first linear function representing the first street is determined from the coordinates of the alignment spots for recognizing the first street according to the least squares method; a second linear function representing the second street is determined from the coordinates of the alignment spots for recognizing the second street according to the least squares method; and the angular difference between the inclination of the first street and that of the second street relative to the X-axis is determined from the first and second linear functions; and in the third step, the first linear function is rotated until the first street has been put in parallelism relative to the X-axis, thereby reducing its angle of inclination to zero, and determining the Y-coordinate of the first street to be the intercept of the so rotated first linear function; and the second linear function is rotated until the second street has been put in parallelism relative to the X-axis, thereby reducing its angle of inclination to zero, and determining the Y-coordinate of the second street to be the intercept of the so rotated second linear function.

The first and second streets may be the opposite outermost streets formed in the workpiece, and the workpiece may be a CSP substrate.

An alignment apparatus to be built in a dicing machine including at least a chuck table for fixedly holding the workpiece, the chuck table being rotatable, and being adapted to be put in a controlled angular position; a cutting means having a cutting blade; a feeding means for moving the chuck table and/or the cutting means relative to each other in directions in which required cuffing may be effected on the workpiece; and an indexing means for moving the chuck table and/or the cutting means a street-to-street distance; the workpiece having a plurality of chip areas defined by a plurality of streets running and crossing in first and second directions and a plurality of alignment spots formed on the surface of the workpiece, is improved according to the present invention in that the alignment apparatus for aligning a selected street and the cutting blade with each other comprises:

an imaging means for taking a picture of the surface of the workpiece, which is fixedly held by the chuck table;

a coordinates detecting-and-storing means for detecting alignment spots which permit recognition of selected first and second streets running in same direction with at least one street intervening therebetween and for determining and storing X- and Y-coordinates of the first and second streets, provided that X-axis is corresponding to a feeding-and-cutting direction whereas Y-axis is corresponding to a feeding-and-indexing direction;

a linear function determining means for determining first and second linear functions $f(x)$ and $g(x)$ representing the first and second streets on the basis of the X- and Y-coordinates of the first and second streets, which are determined in terms of the alignment spots;

a correction angle setting means for determining the angular difference between the first and second linear functions $f(x)$ and $g(x)$ to divide the so determined angular difference by the number of the street-to-street spaces between the first and second streets, thereby determining an angle of correction for each street;

an indexing means for determining the intercepts of the first and second linear functions $f(x)$ and $g(x)$ which have been rotated to be parallel to the X-axis, determining the distance between the first and second linear functions $f(x)$ and $g(x)$, and dividing the so determined distance by the number of the street-to-street spaces between the first and second streets, thereby determining and storing the indexing amount;

a positioning control means for indexing the cuffing blade in the Y-axial direction and for aligning a selected street with the X-axis on the basis of the angle of correction and the indexing amount;

an alignment data storage means connected to the coordinates detecting-and-storing means, the linear function determining means, the correction angle setting means, the indexing means and the positioning means for storing pieces of alignment information pertaining to the workpiece for permitting random access.

In the coordinates detecting-and-storing means, at least three alignment spots may be detected for recognizing the first street and the second street respectively, and the coordinates of the so detected alignment spots may be stored;

In the linear function determining means, a first linear function representing the first street may be determined from the coordinates of the alignment spots for recognizing the first street according to the least squares method; and a second linear function representing the second street may be determined from the coordinates of the alignment spots for recognizing the second street according to the least squares method.

The required alignment can be so controlled as to be in conformity with any amount of deviation by which a selected street is apart from a correct position, relying on the coordinates of the alignment spots of no more than two selected streets, eliminating the necessity of taking pictures of all streets for detecting their alignment spots. The productivity, therefore, cannot be lowered.

The angle of correction and the indexing amount for each street are determined from the linear functions approximating selected streets according to the least squares method, thus assuring that cutting is effected without permitting invasion into any square chip area.

Other objects and advantages of the present invention will be understood from the following description of a cutting machine equipped with an alignment apparatus according to the present invention, which is shown in accompanying drawings.

DETAILED DESCRIPTION OF PREFERRED EMBODIMENT

Figure 1:
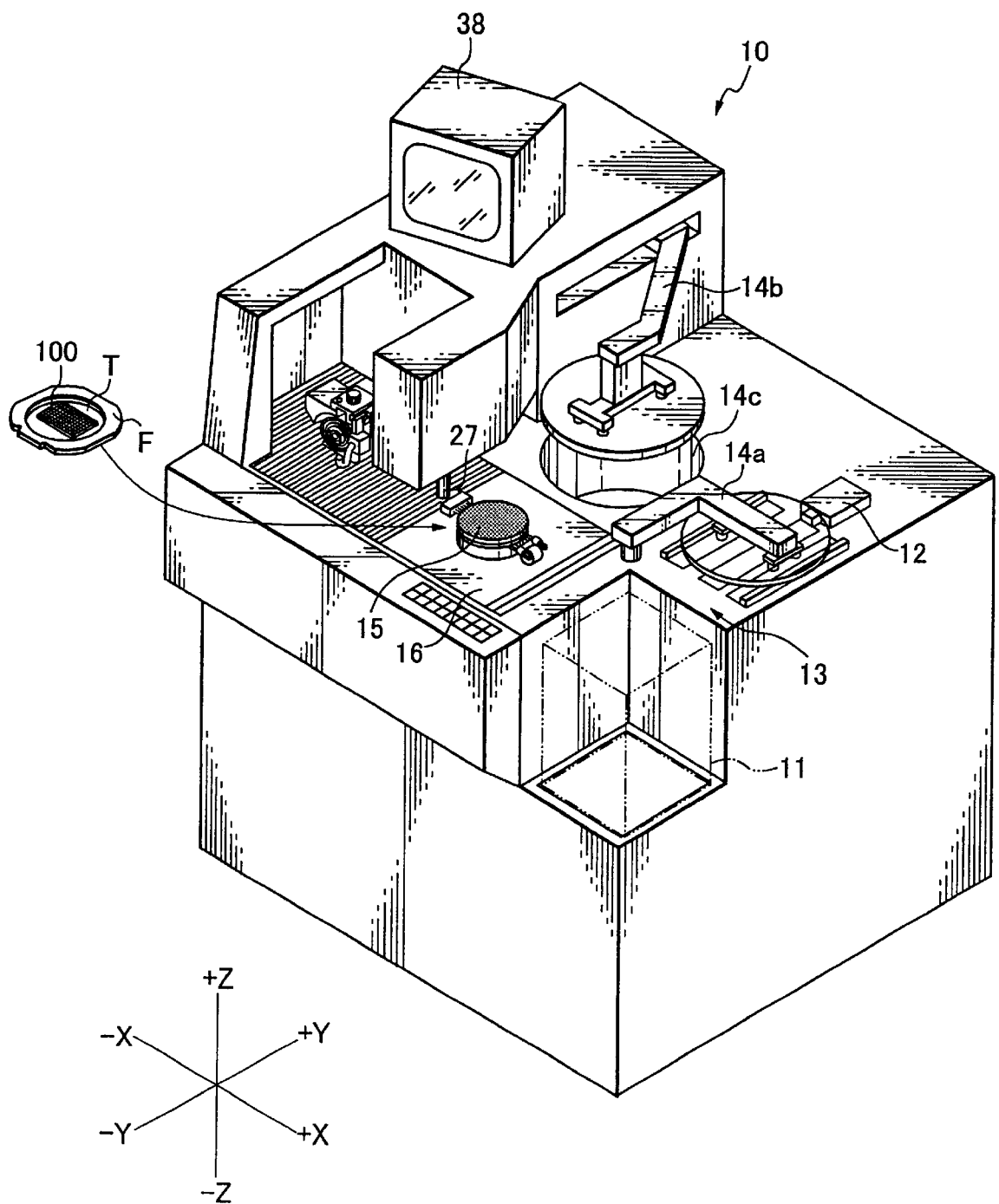
FIG. 1 is a perspective view of a cutting machine which can be equipped with an alignment apparatus according to the present invention.
Figure 2:
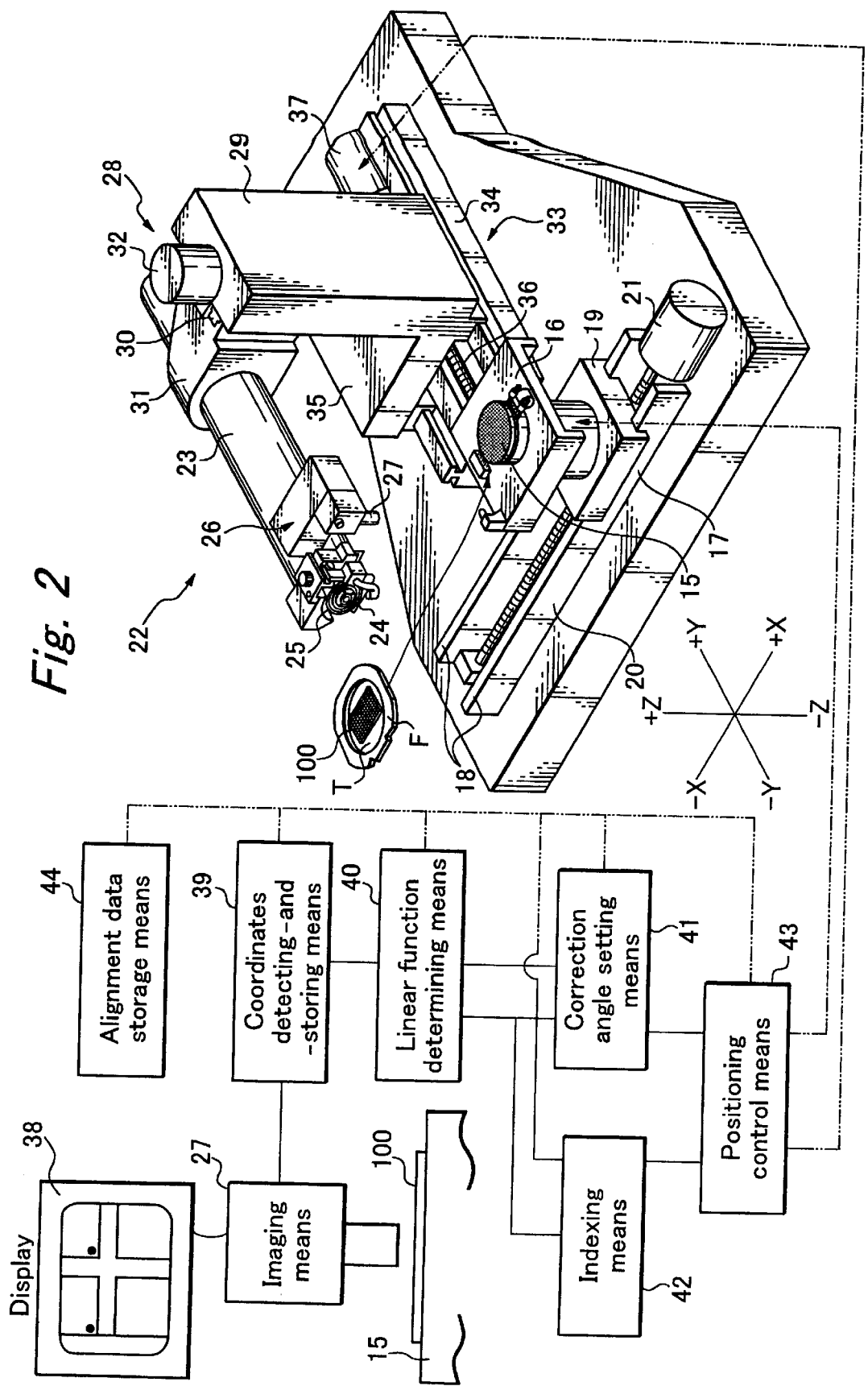
FIG. 2 illustrates the structure of the alignment apparatus according to the present invention in block form, indicating which parts of the cutting machine are operatively connected to which parts of the alignment apparatus.

Referring to FIGS. 1 and 2, a dicing machine 10 includes at least a chuck table 15 for use in fixedly holding a workpiece such as a CSP board 100; a cutting means 22 having a cutting blade 25; a feeding means for moving the chuck table 15 and/or the cutting means 22 relative to each other in directions in which required cutting may be effected on the CSP board 100; and an indexing means 42 for moving the chuck table 15 and/or the cutting means 22 a street-to-street distance. Specifically, the CSP board 100 is attached to a holding frame F with an adhesive tape T. A lot of framed CSP boards are stacked in a cassette 11. Then, the framed CSP boards 100 are transferred from the cassette 11 to a tentative storage area 13 by a putting in-and-taking out means 12. The framed CSP board 100 is transferred from the tentative storage area 13 to the chuck table 15 by a first transfer means 14a.

As seen best from FIG. 2, the chuck table 15 is rotatably supported by an X-axial movable table 16, and therefore, it can be moved by an X-axial feeding means 17 in the X-axial direction in which a required cutting is effected along a selected street on the CSP board 100.

The X-axial feeding means 17 comprises a pair of guide rails 18 laid in the X-axial direction, a slider block 19 mounting on the guide rails 18, a screw rod 20 threadedly engaged with the tapped hole of the slider block 19 and an X-axial stepping motor 21 connected to the screw rod 20. The X-axial movable table 16 is fixed to the slider block 19.

As shown in FIG. 2, the cutting means 22 for dicing the CSP board 100 on the chuck table 15 has the cutting blade 25 fixed to an associated spindle 24, which is, in turn, supported rotatably in a spindle housing 23. The alignment apparatus 26 is fixed to one side of the spindle housing 23. The alignment apparatus 26 has an imaging means 27 directed downward, and the imaging means 27 and the cutting blade are aligned with the X-axial direction.

The cutting means 22 can be moved by an incision feeding means 28 in the Z-axial direction in which the cutting blade 25 invades the wafer 100. The incision feeding means 28 comprises a pair of Z-axial guide rails 30 laid on the upright wall 29, a rising-and-descending block 31 mounting on the Z-axial guide rails 30, a Z-axial screw rod (not shown) threadedly engaged with the tapped hole of the rising-and-descending block 31 and a Z-directional stepping motor 32 whose shaft is connected to the Z-axial screw rod. The incision feeding means 28 is movably supported by an index feeding means 33 so that it may be moved in the indexing direction (the Y-axial direction in the drawing), which is perpendicular to the incision direction (the X-axial direction in the drawing). The index feeding means 33 comprises a pair of Y-axial guide rails 34, a Y-axially movable block 35 mounting on the Y-axial guide rails 34, a Y-axial screw rod 36 threadedly engaged with the tapped hole (not shown) of the Y-axially movable block 35 and a Y-directional stepping motor 37 whose shaft is connected to the Y-axial screw rod 36. The Y-axially movable block 35 is integrally connected to the upright wall 29.

In dicing a CSP board 100 having chip areas defined by crossing streets and alignment spots formed on its upper surface, it is necessary to align the cutting blade 25 with a selected street to be cut, first. The chuck table 15 is moved in the X-axial direction by the X-axial feeding means 17, and at the same time, the imaging means 27 is moved in the Y-axial direction, so that the CSP board 100 may be put just under the imaging means 27, and then, a picture of the surface of the CSP board is taken.

Figure 3:
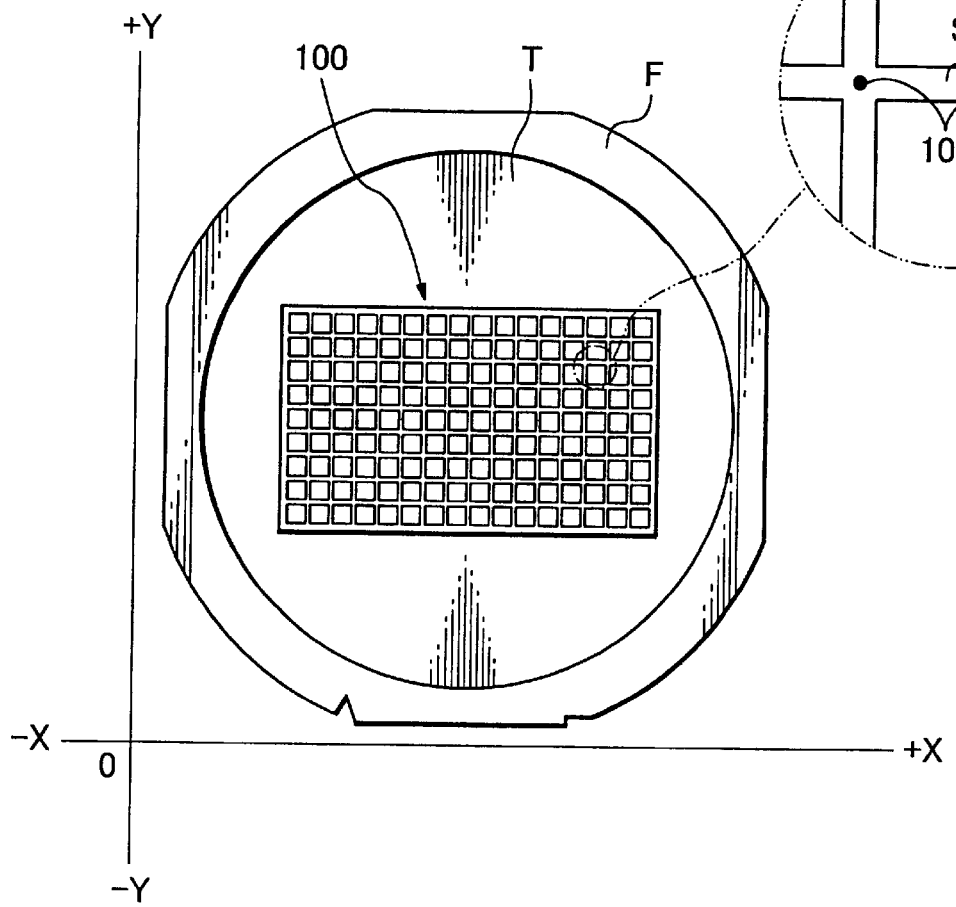
FIG. 3 is a plane view of one example of the CSP board to which the alignment method according to the present invention can be applied.

Referring to FIG. 3, the CSP board 100 has square CSP chip areas 101 defined by crossing streets S1 and S2. The streets S1 run in a first direction, and the streets S2 run in a second direction, which is perpendicular to the first direction. Thus, a lattice pattern is formed on the CSP board 100.

As seen from the enlarged part of the drawing, an alignment spot 102 is formed at the center of each crossing of the first and second streets S1 and S2, thus permitting the position of the street to be given in terms of the coordinate of the alignment spot at the crossing.

Figure 4:
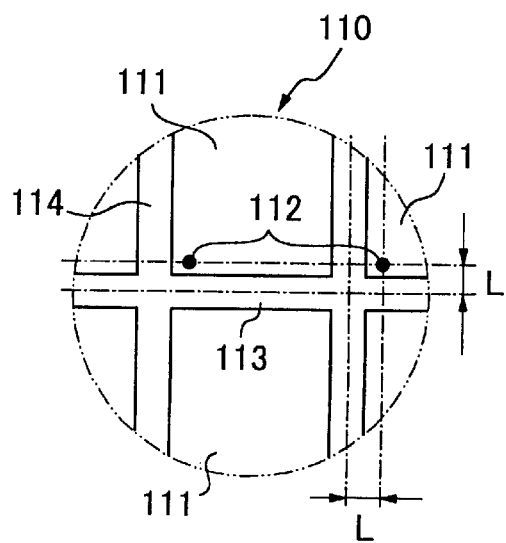
FIG. 4 is an enlarged plane view of another example of the CSP board.

Referring to FIG. 4, an alignment spot 112 may be formed within each CSP chip area 111. The distance L between the alignment spot 112 and the centerline of each crossing street 113 or 114 running in the first or second direction is determined, and the coordinate of the crossing street is determined by subtracting the distance L from the coordinate of the alignment spot 112.

Referring to FIG. 2 again, the alignment apparatus 26 comprises: an imaging means 27 for taking a picture of the surface of the workpiece, which is fixedly held by the chuck table 15; a coordinates detecting-and-storing means 39 for detecting alignment spots and retrieving their coordinates; a linear function determining means 40 for determining linear functions representing selected streets on the basis of their coordinates; a correction angle setting means 41 for determining the angle of correction for each street on the basis of the linear functions; an indexing means 42 for determining a required indexing amount for each street on the basis of the linear functions; a positioning control means 43 for controlling rotation of the chuck table 15 and the index feeding means 33, thereby putting the cutting blade in alignment with a selected street; and an alignment data storage means 44 for providing the above described means with required pieces of information when requested.

Referring to FIG. 3 again, after all streets S1 in the first direction are cut on the CSP board, the chuck table 15 is rotated 90 degrees, and then all streets S2 in the second direction are cut to provide the square CSP chips. The manner in which a required alignment between the cutting blade 25 and a selected street is made is described below.

The alignment data storage means 44 stores pieces of information pertaining to the streets in the first and second directions in terms of: the number "h" of the streets;

the street-to-street space;

the form of alignment spots;

the distance "L" from the alignment spot to the centerline of the street;

the coordinates of the opposite, outermost streets; and the coordinate (x0, y0) of the center of rotation "S" of the chuck table 15.

Figure 5:
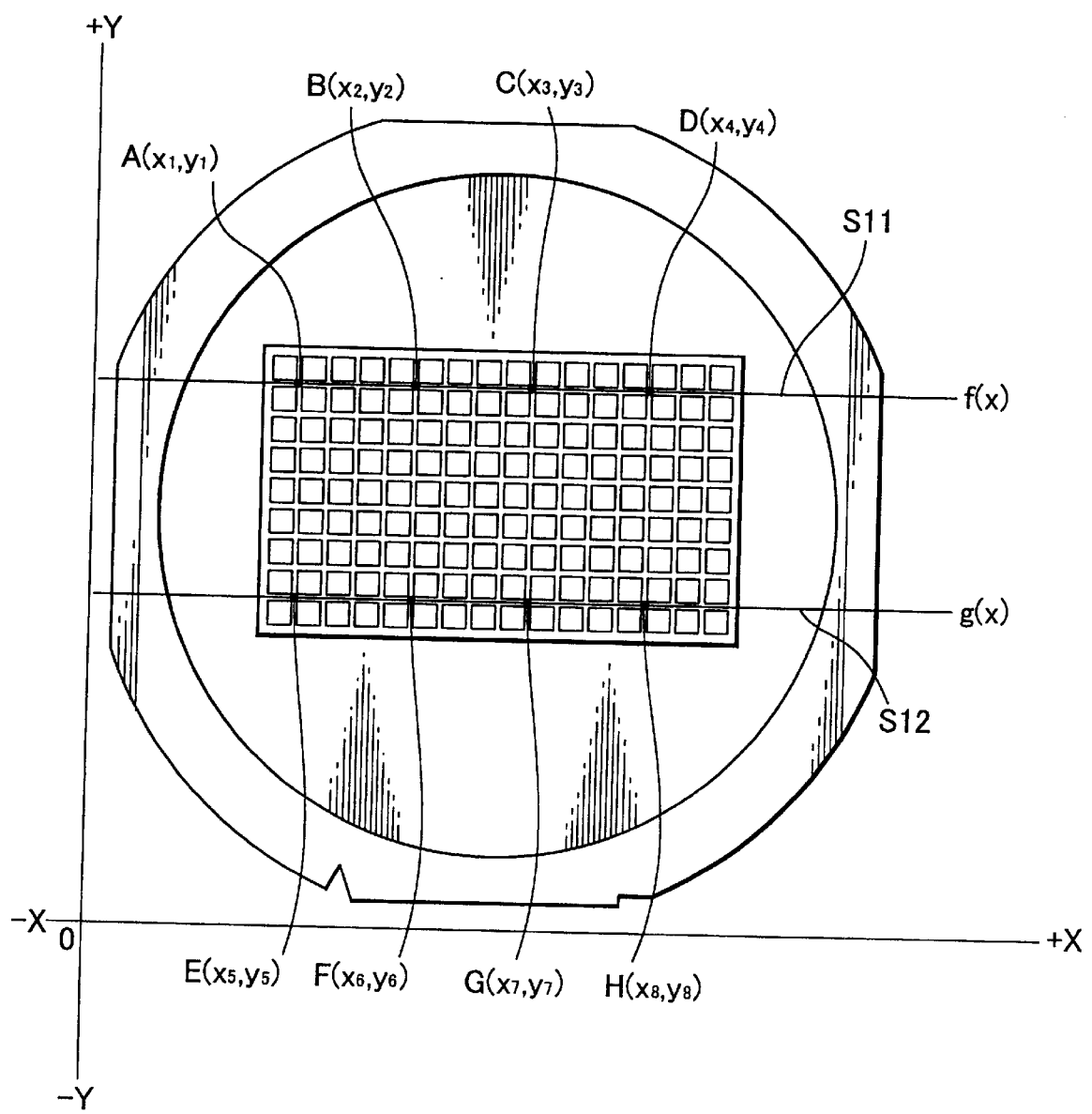
FIG. 5 is a plane view of the CSP board, illustrating the streets and alignment spots.

Referring to FIG. 5, first, the angle of inclination at which one of the opposite outermost streets S11 running in the first direction is oblique to the X-axis is determined. The coordinates of four alignment spots A (x1, y1), B (x2, y2), C (x3, y3) and D (x4, y4) are determined. Although the coordinates of four alignment spots are determined in this particular example, it suffices that the coordinates of three alignment spots are determined.

Referring to FIG. 2, the imaging means 27 takes a picture of the first street S11 on the CSP board, and the picture thus taken is displayed on the display 38 when occasions demand. At the same time, the X- and Y-coordinates of the alignment spots A, B, C and D are stored in the coordinates detecting-and-storing means 39.

Then, the imaging means 27 takes a picture of the second street S12 remotest from the first street S11, and the picture thus taken is displayed on the display 38 when occasions demand. The X- and Y-coordinates of the alignment spots E, F, G and H are stored in the coordinates detecting-and-storing means 39 (the first step). In this particular example alignment spots pertaining to the opposite, outermost streets are detected. It, however, suffices that alignment spots pertaining to two streets between which at least one street intervenes are detected.

Second, in the linear function determining means 40 the angles of inclination at which the first and second streets S11 and S12 are oblique to the X-axis are determined on the basis of the alignment spots A to H. Specifically, a first linear function f(x) is determined as passing by the alignment spots A, B, C and D at the closest distances to these spots in FIG. 5. Likewise, a second linear function g(x) is determined as passing by the alignment spots E, F, G and H at the closest distances to these spots. These linear functions f(x) and g(x) have the coordinate origin O(0,0) in common.

The manner in which these linear functions are determined is described as follows:

In general, a straight line in the X- and Y-coordinate system can be given by:

$$Y = mx + b \tag{1}$$

where "m" stands for gradient; and "b" stands for the Y-coordinate (the Y-segment).

Assume that "n" spots are scattered close to a straight line in the X- and Y-coordinate system, a straight line passing by these spots at the closest distances can be determined according to the least squares method. Specifically the gradient, "m" and the Y-segment, "b" in Equation (1) can be determined by Equations (2) and (3).

$$m = \frac{n\left(\sum_{i=1}^{n} x_i y_i\right)\left(\sum_{i=1}^{n} x_i\right)\left(\sum_{i=1}^{n} y_i\right)}{n\left(\sum_{i=1}^{n} (x_i^2)\right) - \left(\sum_{i=1}^{n} x_i\right)^2} \tag{2}$$

$$b = \frac{\left(\sum_{i=1}^{n} y_i\right)\left(\sum_{i=1}^{n} (x_i^2)\right) - \left(\sum x_i\right)\left(\sum x_i y_i\right)}{n\left(\sum_{i=1}^{n} (x_i^2)\right) - \left(\sum_{i=1}^{n} x_i\right)^2} \tag{3}$$

The linear function f(x) representing the straight line passing by the alignment spots A to D and the linear function g(x) representing the straight line passing by the alignment spots E to H can be determined according to the least square method as follows:

$$f(x) = Mx + B \tag{4}$$

$$g(x) = M'x + C \tag{5}$$

M, B and M'x, C can be determined from following Equations (6) to (9).

$$M = \frac{4\left(\sum_{i=1}^{4} x_i y_i\right)\left(\sum_{i=1}^{4} x_i\right)\left(\sum_{i=1}^{4} y_i\right)}{4\left(\sum_{i=1}^{4} (x_i^2)\right) - \left(\sum_{i=1}^{4} x_i\right)^2} \tag{6}$$

$$B = \frac{\left(\sum_{i=1}^{4} y_i\right)\left(\sum_{i=1}^{4} (x_i^2)\right) - \left(\sum_{i=1}^{4} x_i\right)\left(\sum_{i=1}^{4} x_i y_i\right)}{4\left(\sum_{i=1}^{4} (x_i^2)\right) - \left(\sum_{i=1}^{4} x_i\right)^2} \tag{7}$$

$$M' = \frac{4\left(\sum_{i=5}^{8} x_i y_i\right)\left(\sum_{i=5}^{8} x_i\right)\left(\sum_{i=5}^{8} y_i\right)}{4\left(\sum_{i=5}^{8} (x_i^2)\right) - \left(\sum_{i=5}^{8} x_i\right)^2} \tag{8}$$

$$C = \frac{\left(\sum_{i=5}^{8} y_i\right)\left(\sum_{i=5}^{8} (x_i^2)\right) - \left(\sum_{i=5}^{8} x_i\right)\left(\sum_{i=5}^{8} x_i y_i\right)}{4\left(\sum_{i=5}^{8} (x_i^2)\right) - \left(\sum_{i=5}^{8} x_i\right)^2} \tag{9}$$

From the gradients of the linear functions f(x) and g(x) thus obtained the angles of inclination relative to the X-axis are determined. FIG. 5 shows two linear functions inclining to the X-axis in exaggerated way.

Figure 6:
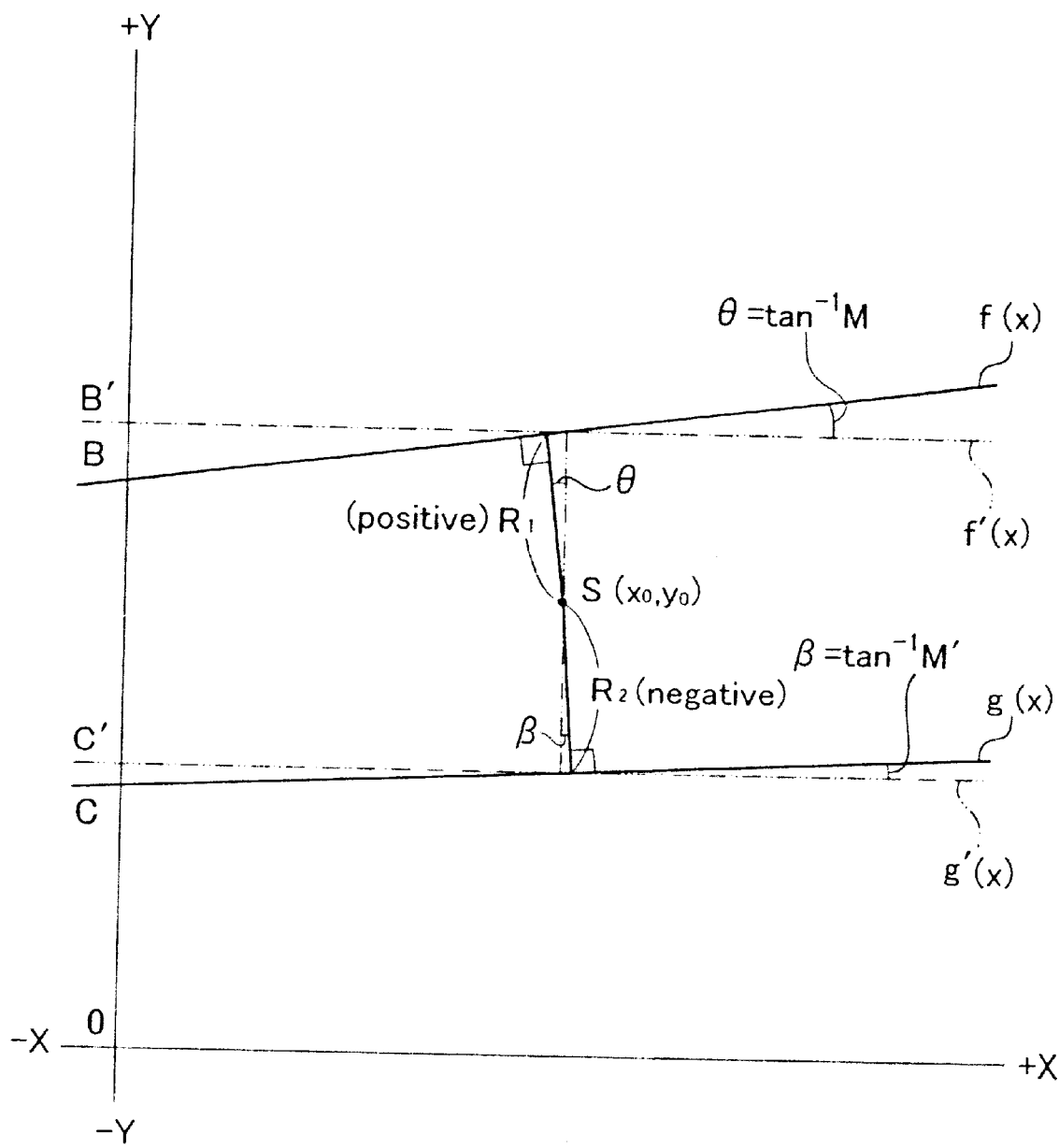
FIG. 6 illustrates the linear functions representing selected streets on which required alignment are effected.
Figure 7:
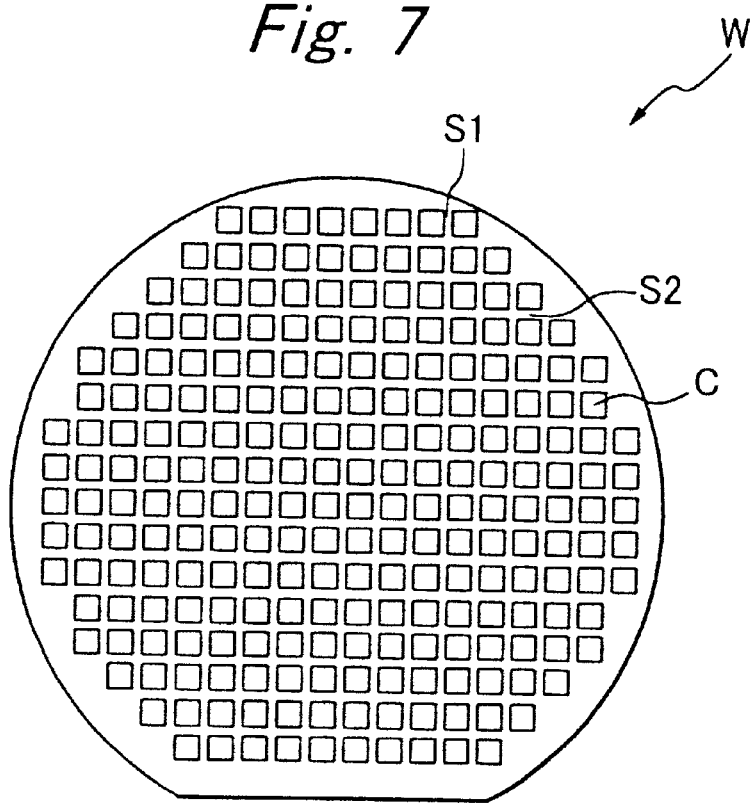
FIG. 7 is a plane view of a semiconductor wafer.
Figure 8:
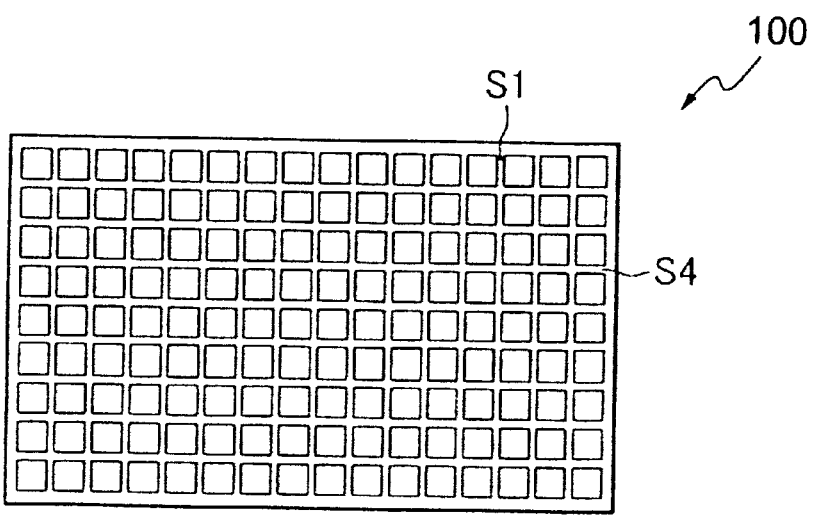
FIG. 8 is a plane view of a CSP board.

Referring to FIG. 6, the coordinate of the center of the chuck table $S(x_0, y_0)$ is stored in the alignment data storage means 44. First, the linear function f(x) is rotated clockwise about the point of center S until it has been put in parallelism with the X-axis, and then, the linear function thus provided is referred to as f'(x). The angle of rotation θ, which is formed between the first street 11 and the X-axis, is given by:

$$\theta = \tan^{-1} M$$

While the linear function f(x) is being rotated, the distance $R_1$ (positive value) between the linear function f(x) and the point of center S remains constant. The linear function f'(x) which is given by putting the linear function f(x) in parallelism with the X-axis (i.e., M=0) is given by:

$$f'(x) = R_1 + y_0 \tag{10}$$

The Y-segment B' for the linear function f'(x) is given by:

$$B' = R_1 + y_0 \tag{11}$$

B' can be determined by putting the following terms in Equation 4:

$$M = \sin\theta / \cos\theta \tag{12}$$

$$x = x_0 + R_1 \sin\theta \tag{13}$$

$$f(x) = y_0 + R_1 \cos\theta \tag{14}$$

Then, the resultant equation is given by:

$$R_1 = x_0 \sin\theta + B \cos\theta - y_0 \cos\theta \tag{15}$$

The y-segment B' can be obtained by putting Equation (15) in Equation $$B' = x_0 \sin\theta + B \cos\theta + y_0(1 - \cos\theta) \tag{16}$$

Likewise, the linear function g(x) is rotated clockwise about the point of center S until it has been put in parallelism with the X-axis, and then, the linear function thus provided is referred to as g'(x). The angle of rotation β, which is formed between the second street 12 and the X-axis, is given by:

$$\beta = \tan^{-1} M'$$

While the linear function g(x) is being rotated, the distance $R_2$ (negative value) between the linear function g(x) and the point of center S remains constant. The linear function g'(x) which is given by putting the linear function g(x) in parallelism with the X-axis (i.e., M'=0) is given by:

$$g'(x) = R_2 + y_0 \tag{17}$$

The Y-segment C' for the linear function g'(x) is given by:

$$C' = R_2 + y_0 \tag{18}$$

C' can be determined by putting the following terms in Equation 5:

$$M' = \sin\beta / \cos\beta \tag{19}$$

$$x = x_0 - R_2 \sin\beta \tag{20}$$

$$g(x) = y_0 + R_2 \cos\beta \tag{21}$$

Then, the resultant equation is given by:

$$R_2 = x_0 \sin\beta + B \cos\beta + y_0 \cos\beta \tag{22}$$

The Y-segment C' can be obtained by putting Equation (22) in Equation (18):

$$C' = x_0 \sin \beta + B \cos \beta + y_0(1 - \cos \beta) \qquad (23)$$

Now, the distance between the linear function f(x) and the linear function g(x), that is, the distance between the first street S11 and the second street S12 can be determined as (B'–C').

Thus, the first and second streets S11 and S12 are given by the linear functions f'(x) and g'(x) on the X-Y coordinate system; the angle θ formed between the first street S11 and the X-axis, and the angle β formed between the second street S12 and the X-axis are determined; and the distances B' and C' from the origin of coordinate to the first and second streets in the Y-axial direction are determined. Now, a required alignment can be made on the basis of these factors as follows:

In the correction angle setting means 41 the difference (θ–β) between the inclination angle θ of the first street S11 and the inclination angle β of the second street S12 is determined. Then, the number "h" of all streets between the first and second streets 11 and 12 is retrieved from the alignment data storage means 44, and the angular difference (θ–β) is divided by the number of the street-to-street spaces (h–1). The division (θ–β)/(h–1) is stored in the correction angle setting means 41. The so stored division represents the angular correction per each street or the correction of angle (second step).

In the indexing means 42 the space (B'–C') between the first and second streets S11 and S12 is divided by the number of the street-to-street spaces (h–1), and the division (B'–C')/(h–1) is stored. The division is an indexing amount per each street (third step).

In a case where the second street S12 is cut first (see FIG. 5), the cutting means 22 is moved in the Y-axial direction by the index feeding means 33 until the Y-coordinate of the cutting blade 25 has been put on the Y-segment C' (fourth step).

Then, the chuck table 15 is rotated β to put g(x) in alignment with g'(x), that is, the second street S12 is put in parallelism with the X-axis. The cutting means 22 is lowered until the cutting blade 25 has reached the CSP board 100, and the chuck table 15 is moved in the –X-axial direction, thereby allowing the cutting blade 25 to cut the second street S12. The movement of the cutting means 22 in the Y-axial direction and the rotation of the chuck table 15 are controlled by the positioning control means 43.

After the second street S12 is cut, the subsequent streets can be cut sequentially as follows:

1) the chuck table 15 is rotated (θ–β)/(h–1) so that the subsequent street is put in parallelism with the X-axis (fourth step);
2) the cutting means 22 is moved (B'–C')/(h–1) in the +Y-axial direction (fourth step);
3) the chuck table 15 is moved in the +X-axial direction, and the cutting means 22 is lowered to reach the CSP board 100, allowing the cutting blade 25 rotating at a high-speed to cut the street on the CSP board.

The steps (1) to (3) are repeated so that all streets in the first direction are cut. Likewise, all streets in the second direction are aligned and cut to provide CSP chips.

In a case where each alignment spot is not formed on the center line of the street as shown in FIG. 4, the cutting blade 25 can be put in alignment with the street by adding or subtracting the distance between the center line of the street and the alignment spot ("L" in FIG. 4).

As described above, each and every street is so aligned with the cutting blade that any street deviation may be compensated for, thus preventing any CSP area from being cut. Determination of a linear function according to the least squares method permits a straight line closest to all alignment spots to be obtained even though the street should be deviated more or less, and accordingly the accuracy with which a required alignment can be made is increased, and hence the accuracy with which a selected street can be cut is improved.

The CSP board after being diced is transferred to the rinsing station 14c by the transfer means 14b, and it is rinsed and dried there. Finally the diced CSP board is put in the cassette 11.

As may be understood from the above, an alignment method according to the present invention assures that a correct alignment is made even though alignment spots should be deviated as a consequence of non-parallelism in streets. It is unnecessary to take pictures of all streets and alignment spots in making alignments required for all streets, but it suffices that alignments are made only on two or more selected streets, permitting required alignments to be made for the remaining streets without the necessity of taking pictures of the remaining streets and their alignment spots. Accordingly the time involved for aligning can be reduced to possible minimum, and the productivity cannot be lowered significantly.

Three or more alignment spots are detected for each of the selected streets, and a linear function representing the street is determined from the coordinates of these alignment spots according to the least squares method. Then, the angle of correction and the indexing amount for each street are determined. The cutting is effected along the line running among alignment spots which are closely gathered, thereby dicing the semiconductor wafer without cutting in chip areas.

What is claimed is:

1. In dicing a workpiece having a plurality of chip areas defined by a plurality of streets running and crossing in a first and a second directions and a plurality of alignment spots formed on a surface of the workpiece, the workpiece being diced by a dicing machine including at least a chuck table for fixedly holding the workpiece, the chuck table being rotatable, and being adapted to be put in a controlled angular position; a cutting means having a cutting blade; a feeding means for moving the chuck table and/or the cutting means relative to each other in directions in which required cutting may be effected on the workpiece; and indexing means for moving the chuck table and/or the cutting means a street-to-street distance, an alignment method for aligning a selected street and the cutting blade with each other comprising:

a first step of: imaging the surface of the workpiece to detect alignment spots which permit recognition of selected first and second streets running in same direction with at least one street intervening therebetween, determining and storing X- and Y-coordinates of the first and second streets, provided that X-axis is corresponding to a feeding-and-cutting direction whereas Y-axis is corresponding to a feeding-and-indexing direction;

a second step of: determining an angular difference between an inclination of the first street and that of the second street based on the coordinates of the detected alignment spots, obtaining an angle of correction for each street by dividing the angular difference by number of street-to-street spaces existing between the first and second streets, and storing the angle of correction;

a third step of: putting the first and second streets in parallelism with the X-axis to determine the Y-coordinates of intercept of so oriented first and second streets and a distance between the so oriented first and second streets, determining an indexing amount by dividing so determined distance by number of the street-to-street spaces existing between the first and second streets, and storing so determined indexing amount; and a fourth step of: moving the cutting blade and/or the workpiece in the Y-axial direction based on both of the so determined angle of correction and the indexing amount so that the cutting blade may be put exactly in alignment with a selected street to be cut.

2. An alignment method according to claim 1, wherein in the first step: at least three alignment spots are detected for recognizing the first street and the second street respectively, and the coordinates of the so detected alignment spots are stored;

in the second step: a first linear function representing the first street is determined from the coordinates of the alignment spots for recognizing the first street according to the least squares method; a second linear function representing the second street is determined from the coordinates of the alignment spots for recognizing the second street according to the least squares method; and the angular difference between the inclination of the first street and that of the second street is determined relative to the X-axis from the first and second linear functions; and in the third step: the first linear function is rotated until the first street has been put in parallelism relative to the X-axis, thereby reducing the angle of inclination to zero and determining the Y-coordinate of the first street to be the intercept of the so rotated first linear function; and the second linear function is rotated until the second street has been put in parallelism relative to the X-axis, thereby reducing the angle of inclination to zero and determining the Y-coordinate of the second street to be the intercept of the so rotated second linear function.

3. An alignment method according to claim 1, wherein the first and second streets are the opposite outermost streets formed in the workpiece.

4. An alignment method according to claim 1, wherein the workpiece is a CSP substrate.

5. An alignment apparatus to be built in a dicing machine including at least a chuck table for fixedly holding a workpiece, the chuck table being rotatable, and being adapted to be put in a controlled angular position; a cutting means having a cutting blade; a feeding means for moving the chuck table and/or the cutting means relative to each other in directions in which required cutting may be effected on the workpiece; and an indexing means for moving the chuck table and/or the cutting means a street-to-street distance; the workpiece having a plurality of chip areas defined by a plurality of streets running and crossing in first and second directions and a plurality of alignment spots formed on a surface of the workpiece, characterized in that the alignment apparatus for aligning a selected street and the cutting blade with each other comprises:

an imaging means for taking a picture of the surface of the workpiece, which is fixedly held by the chuck table;

a coordinates detecting-and-storing means for detecting alignment spots which permit recognition of selected first and second streets running in same direction with at least one street intervening therebetween and for determining and storing X- and Y-coordinates of the first and second streets, provided that X-axis is corresponding to a feeding-and-cutting direction whereas Y-axis is corresponding to a feeding-and-indexing direction;

a linear function determining means for determining first and second linear functions $f(x)$ and $g(x)$ representing the first and second streets on the basis of the X- and Y-coordinates of the first and second streets memorized in the coordinates detecting-and-storing means;

a correction angle setting means for determining and storing an angular difference between the first and second linear functions $f(x)$ and $g(x)$ to divide the so determined angular difference by number of the street-to-street spaces between the first and second streets, thereby determining and storing an angle of correction for each street;

an indexing means for determining the intercepts of the first and second linear functions $f(x)$ and $g(x)$ which have been rotated to be parallel to the X-axis, determining a distance between the first and second linear functions $f(x)$ and $g(x)$, and dividing so determined distance by number of the street-to-street spaces between the first and second streets, thereby determining and storing the indexing amount;

a positioning control means for indexing the cutting blade in Y-axial direction and aligning a selected street with the X-axis on the basis of the angle of correction and the indexing amount; and an alignment data storage means connected to the coordinates detecting-and-storing means, the linear function determining means, the correction angle setting means, the indexing means and the positioning means for storing pieces of alignment information pertaining to the workpiece for permitting random access.

6. An alignment apparatus according to claim 5, wherein in the coordinates detecting-and-storing means, at least three alignment spots are detected for recognizing the first street and the second street respectively, and the coordinates of the so detected alignment spots are stored;

in the linear function determining means, a first linear function representing the first street is determined from the coordinates of the alignment spots for recognizing the first street according to the least squares method; and a second linear function representing the second street is determined from the coordinates of the alignment spots for recognizing the second street according to the least squares method.

7. An alignment method according to claim 2, wherein the workpiece is a CSP substrate.

8. An alignment method according to claim 3, wherein the workpiece is a CSP substrate.

* * * * *